US009070520B2

(12) United States Patent
Chen

(10) Patent No.: US 9,070,520 B2
(45) Date of Patent: Jun. 30, 2015

(54) ILLUMINATION MODULE AND ILLUMINATED KEYBOARD HAVING THE SAME

(75) Inventor: Shu I Chen, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 419 days.

(21) Appl. No.: 13/451,365

(22) Filed: Apr. 19, 2012

(65) Prior Publication Data

US 2013/0278448 A1 Oct. 24, 2013

(51) Int. Cl.
*H03K 17/94* (2006.01)
*H01H 13/83* (2006.01)

(52) U.S. Cl.
CPC ......... *H01H 13/83* (2013.01); *H01H 2219/044* (2013.01); *H01H 2219/062* (2013.01); *H01H 2219/064* (2013.01)

(58) Field of Classification Search
CPC . H01H 13/83; H01H 2219/062; G06F 3/0202
USPC ............. 341/22; 345/168, 170; 200/314, 310; 362/85, 602, 605
See application file for complete search history.

(56) References Cited

U.S. PATENT DOCUMENTS 7,283,066 B2 * 10/2007 Shipman ......................... 341/22
7,294,803 B2 * 11/2007 Lee et al. ...................... 200/314
7,455,415 B2 * 11/2008 Miyahawa et al. ............. 362/30
2007/0041573 A1 2/2007 Jung et al.
2009/0194401 A1 * 8/2009 Kim .............................. 200/314
2009/0196066 A1 8/2009 Masuda et al.
2010/0072047 A1 * 3/2010 Sung et al. .................... 200/314
2010/0097246 A1 * 4/2010 Watanabe et al. ............... 341/22
2010/0128427 A1 * 5/2010 Iso ................................ 200/310
2010/0147661 A1 6/2010 Takeda
2011/0158728 A1 * 6/2011 Ho et al. ....................... 200/314
2013/0121017 A1 * 5/2013 Tsai .............................. 362/602

FOREIGN PATENT DOCUMENTS

JP 2008-60061 A 3/2008
JP 2010-267203 A 11/2010
TW M352758 3/2009
TW M413953 U1 10/2011

* cited by examiner

*Primary Examiner* — Thomas Mullen
(74) *Attorney, Agent, or Firm* — Chun-Ming Shih

(57) ABSTRACT

An illuminated keyboard includes a first housing and a second housing having a slot, and between the first housing and the second housing, an illumination module, a circuit board, a shield member and a plurality of keys are disposed therein in sequence. The illumination module includes a cover and a luminescence unit, light generated by the luminescence unit is transmitted into a trough of the cover and then travels from a light incident surface to a light emitting surface of the cover. The keys respectively are inserted in a plurality of openings of the shield member, and the light from the light emitting surface is projected on the keys through the circuit board and the openings of the shield member and then passes through the slot of the second housing. This prevents brightness non-uniformity of keys and light leakage between adjacent keys of the keyboard.

12 Claims, 12 Drawing Sheets

200

ILLUMINATION MODULE AND ILLUMINATED KEYBOARD HAVING THE SAME

FIELD OF THE INVENTION

The present invention relates to an illumination module and an illuminated keyboard having the same, and more particularly to an illumination module which can reduce light leakage, and an illuminated keyboard having the same.

BACKGROUND OF THE INVENTION

With the progress of the times, a computer is one of the most popular electronic devices used in life. Currently, a keyboard is one of the indispensable input devices during the computer operation. The keyboard is derived from the typewriter and mainly functions as data input. The keyboard could be employed to input characters, symbols or numbers and, moreover, control the computer operation.

In order to allow users with different requirements to use the keyboard in the simplest way, the design of the keyboard is getting more and more diversified. According to the switch design, the current keyboards could be classified into a mechanical keyboard, a membrane keyboard, a conductive rubber keyboard, and a capacitive keyboard, and the like. While according to the printing manner, the present keyboards could also be classified into blank (with no inscriptions on the keys of the keyboard), ink printing, laser printing, two-color molding, and dye-sublimation printing, and the like.

In addition to the basic input function, the keyboard with visual effects may often attract one's attention. For instance, the commercially available illuminated keyboards are not only attractive but also more useful in the places with insufficient lighting. Hence, the illuminated keyboards are more competitive in the market.

As prior art, the illuminated keyboard includes a plurality of transparent keys and an illumination module (e.g. backlight module) which are both disposed on a cover, in which the illumination module is configured under the plurality of the keys. Therefore, light emitted by the illumination module will pass through the keys, thus allowing the user to see the characters of the keys clearly even in the dark or places with insufficient lighting.

However, the light of the illumination module passes through not only the keys but also a gap between the adjacent keys (light leakage), making it difficult to recognize the characters of the keys. Particularly, the gap between the adjacent keys will become brighter in contrast with the dark or insufficient lighting surrounding, which makes the problem more serious.

Furthermore, in prior art, light emitted by the illumination module is generally guided to the keys by a light guide device; however, the brightness is insufficient for the keys farther away from the illumination module. The brightness non-uniformity of the keys will cause difficulty in recognizing the characters on the keys of the illuminated keyboard.

SUMMARY OF THE INVENTION

In view of the above, the present invention provides an illumination module and an illuminated keyboard that can solve the problems of brightness non-uniformity and light leakage between adjacent keys in prior art.

The present invention discloses an illumination module for a keyboard having a plurality of keys. The illumination module includes a cover having a transparent plate and a plurality of frames, a luminescence unit and a shield member. The transparent plate is composed of a light transparent material and includes a light incident surface and a light emitting surface. The plurality of frames are disposed on the sides of the transparent plate, and the adjacent frames are connected to each other and surround the transparent plate for forming a trough. The luminescence unit emitting light is disposed on one of the frames. The light travels into the trough passing through the frames and emits outwards from the light incident surface to the light emitting surface. The shield member is disposed on the light emitting surface and provided with a plurality of openings. Each of the keys is inserted in each of the openings correspondingly, and the light is projected on the keys through the openings.

The present invention also discloses an illuminated keyboard comprising a first housing, an illumination module, a circuit board, a shield member, a plurality of keys and a second housing, wherein the illumination module is disposed on the first housing and comprises a cover and a luminescence unit, the cover includes a transparent plate and a plurality of frames, the transparent plate is composed of a light transparent material and includes a light incident surface and a light emitting surface, and the frames are disposed on the sides of the transparent plate and the adjacent frames are connected to each other and surround the transparent plate for forming a trough. The luminescence unit is disposed on one of the frames. The light travels into to the trough passing through the frames and emits outwards from the light incident surface to the light emitting surface. The circuit board is composed of the transparent material. The circuit board is disposed on the light emitting surface of the transparent plate, and electrically provided with a plurality of trigger switches. The shield member is disposed on the circuit board and provided with a plurality of openings. Each of keys is inserted in each of openings correspondingly, and the light is projected on the keys after passing through the circuit board and the openings. The second housing covers the shield member, the circuit and the illumination module. The second housing has a slot facing the plurality of openings of the shield member, through which the light is transmitted out of the second housing.

The effect of the present invention is achieved in the following way. The light generated by the luminescence unit may diffuse uniformly by the design of the cover for preventing the problem of non-uniform brightness of the keys. Moreover, the shield member is provided with multiple openings for the multiple keys to be inserted in, so that the light will not come out easily from the gaps between the adjacent keys.

The technical characteristics, realization and effects of the present invention will become apparent with the detailed description of preferred embodiments and related drawings as follows.

DETAILED DESCRIPTION OF EXEMPLARY EMBODIMENTS

Figure 1A:
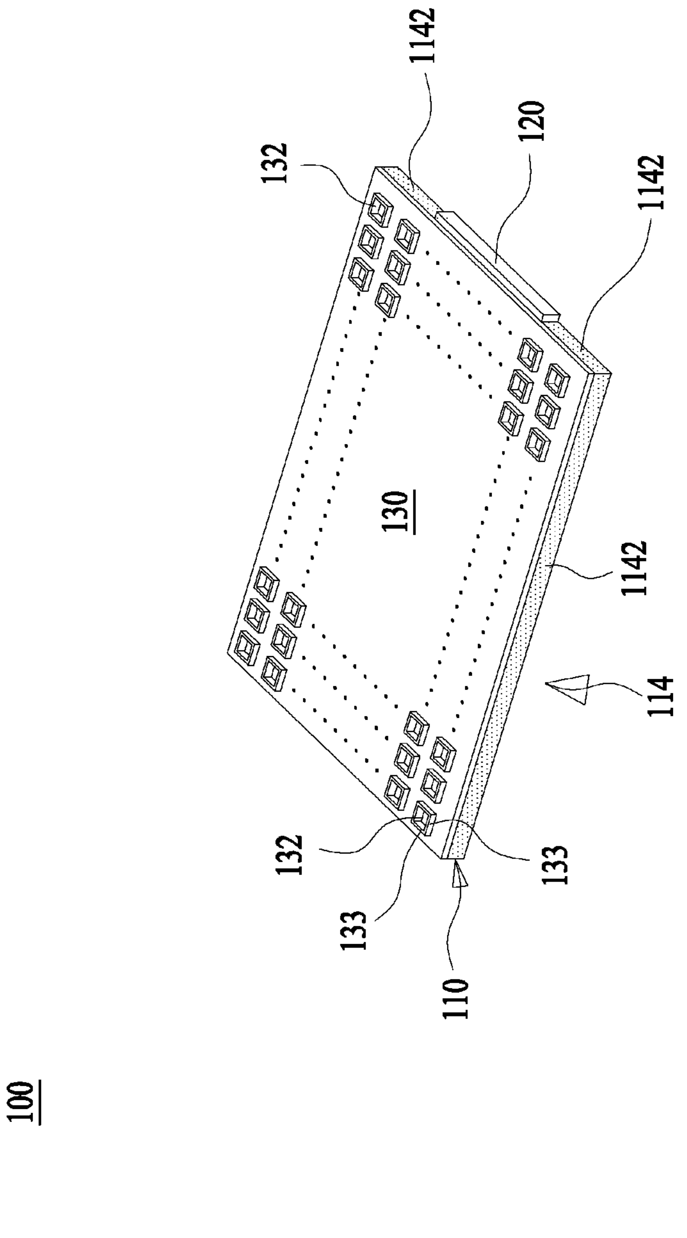
FIG. 1A is a three-dimensional diagram of an illumination module according to a first embodiment of the present invention.
Figure 1B:
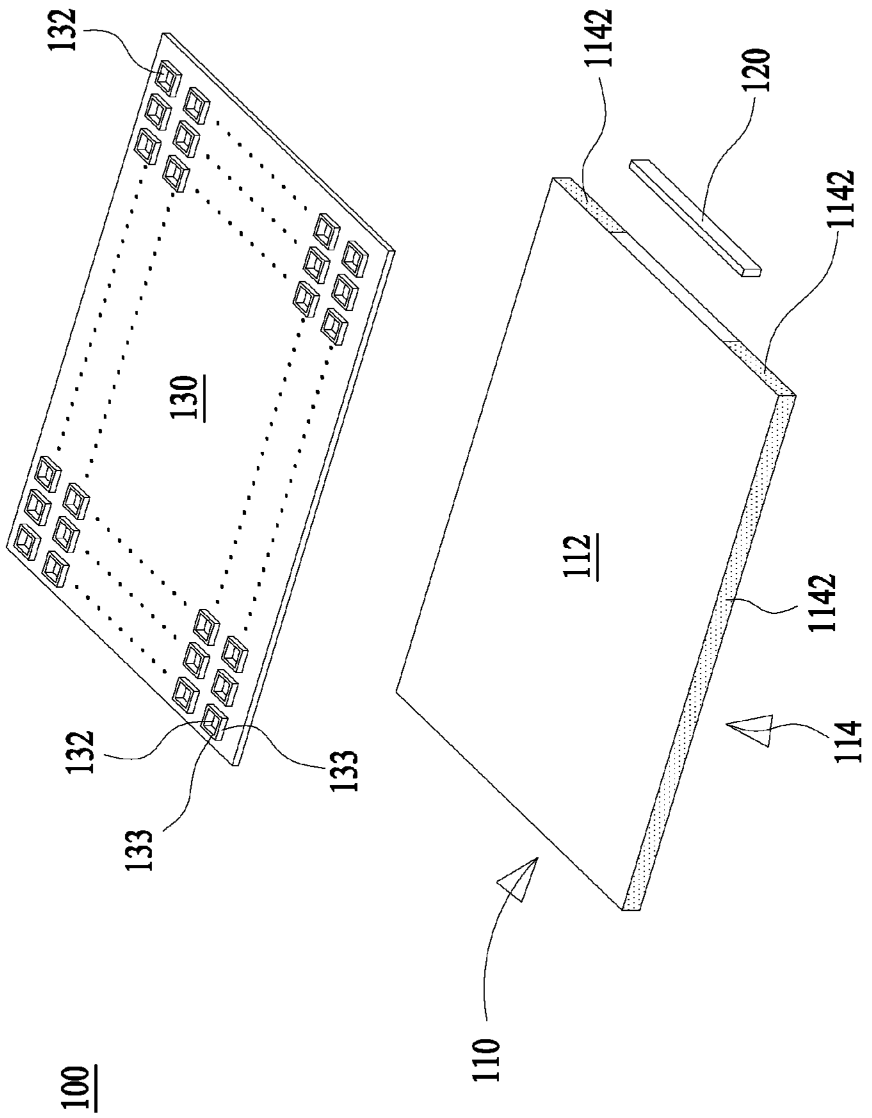
FIG. 1B is an exploded view of the illumination module according to the first embodiment of the present invention.
Figure 1C:
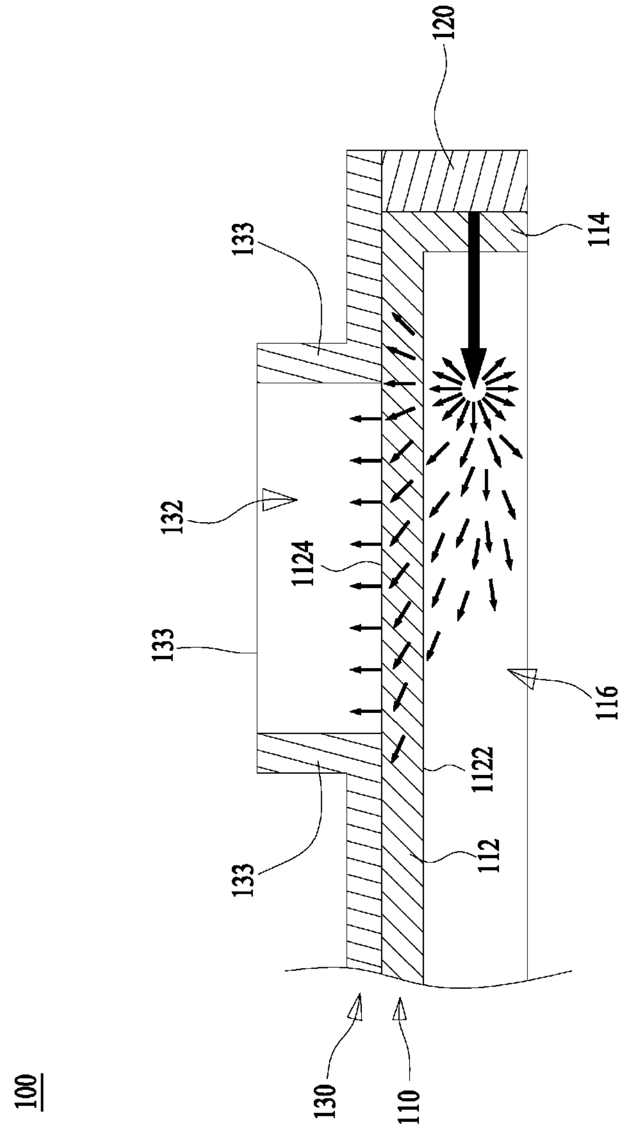
FIG. 1C is a schematic diagram of an optical path of the illumination module according to the first embodiment of the present invention.

Please refer to FIGS. 1A to 1C, which are respectively a three-dimensional diagram and an exploded view of an illumination module 100 and a schematic diagram of an optical path according to a first embodiment of the present invention.

As shown in FIGS. 1A, 1B and 1C, the illumination module 100 according to the first embodiment of the present invention is adapted to a keyboard 200 (of FIGS. 2A-2C) which includes a plurality of keys 240. The illumination module 100 of the first embodiment comprises a cover 110, a luminescence unit 120 and a shield member 130. The cover 110 includes a transparent plate 112 having a light incident surface 1122 and a light emitting surface 1124, and a plurality of frames 114. Among them, the transparent plate 112 is made of a light transparent material such as transparent resin, for example but not limited to, polymethyl methacrylate resin (PMMA), polycarbonate (PC), polystyrene (PS), cyclic olefin copolymers (COCs), cycloolefin polymer (COP), and the like.

The plurality of frames 114 are disposed on sides of the transparent plate 112, the adjacent frames 114 are connected to each other to surround the transparent plate 112 and form a trough 116. That is, the cover 110 is on the whole a hollow structure. According to this embodiment, the transparent plate 112 and the frames 114 could, but not limited to, be formed in one piece, and the luminescence unit 120 is disposed on one of the frames 114 of the cover 110.

The frames 114 of the present invention are made of a light transparent material such as transparent resin, for example but not limited to polymethyl methacrylate resin (PMMA), polycarbonate (PC), polystyrene (PS), cyclic olefin copolymers (COCs), cycloolefin polymer (COP), and the like. The frames 114 are coated with a shading material 1142 except for where the luminescence unit 120 is disposed. Therefore, when the luminescence unit 120 emits (or generates) light, the light travels into the trough 116 of the cover 110 from the frame 114. The shading material 1142 helps to keep the light from going out of the trough 116.

Air existing in the trough 116 of the cover 110 of the present invention facilitates the light to spread and diffuse more evenly in the trough 116 after entering the trough 116, followed by being directed by the transparent plate 112. This allows a more uniform distribution of brightness of the light over the transparent plate 112. In other words, the light from the luminescence unit 120 can diffuse more evenly by using the trough 116 of the cover 110. This can eliminate a situation that the brightness is not uniform for the keys 240 located over the illumination module 100.

By means of the structure of the cover 110 in the present invention, the light from the luminescence unit 120 could be uniformly diffused in the trough 116 of the cover 110. The keys 240 may be disposed over the cover 110 when mounted on the illumination module 100. In this way, the keys 240, when illuminated by the light of the luminescence unit 120, show a uniform brightness due to the optical effect of the cover 110. This can improve a situation that the brightness of the keys 240 is not uniform.

Moreover, in the present invention, the shield member 130 is disposed on the light emitting surface 1124 of the cover 110, and a plurality of openings 132 are formed on the shield member 130 for the keys 240 of the keyboard 200 to be inserted therein. When diffusing to emit from the light emitting surface 1124 of the cover 110, the light will be projected on the keys 240 through the openings 132 without passing through the gap between adjacent keys 240. The keyboard 200 of the present invention is thus radiant and shining. Hence, the user will have no problem in operating the keyboard 200 in the dark or insufficient lighting surroundings because the characters on the keys 240 are readily recognizable.

Furthermore, a plurality of sidewalls 133 are disposed on the cover 110 along sides of the openings 132 in this embodiment with the adjacent sidewalls 133 connected to each other for forming a continuous bulkhead. As a result, when the light diffuses and irradiates from the light emitting surface 1124 of the cover 110, the sidewalls 133 may prevent the light from passing through the gap between the adjacent keys 240 effectively and thus improve light concentration.

Figure 1D:
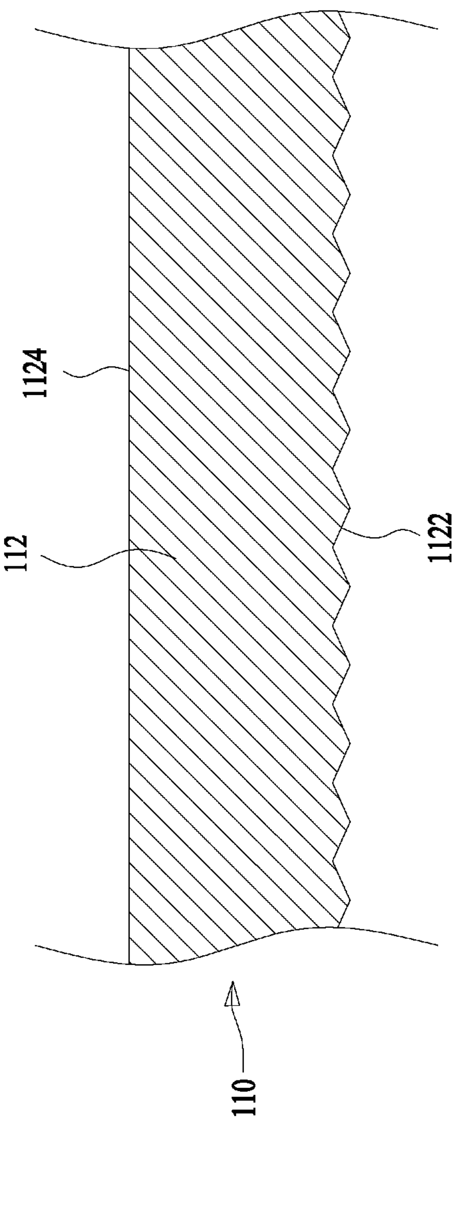
FIG. 1D is a cross-sectional view of a transparent plate according to the first embodiment of the present invention.

FIG. 1D is a cross-sectional view of the transparent plate according to the first embodiment of the present invention. As shown in FIG. 1D, the light will irradiate from the light incident surface 1122 to the light emitting surface 1124 of the transparent plate 112 after entering into and diffusing within the trough 116 of the cover 110. For enhancing the light diffusion effect, some techniques could be employed to the light incident surface 1122 of the cover 110. For enhancing the light diffusion effect, the light incident surface 1122 of the cover 110 may be a prism with a textured surface or coated with a light diffusion coating.

Besides, the light emitting surface 1124 of the transparent plate 112 could be a polished mirror surface for preventing the internal reflection or total reflection of the transparent plate 112. Thus, light is allowed to pass through the light emitting surface 1124 of the transparent plate 112 as much as possible and luminous intensity at the side of the light emitting surface 1124 is increased. As an alternative, the light emitting surface 1124 of the transparent plate 112 could be an arc like a convex lens or a concave mirror to concentrate the light to be emitted outwards from the light emitting surface 1124.

Figure 2A:
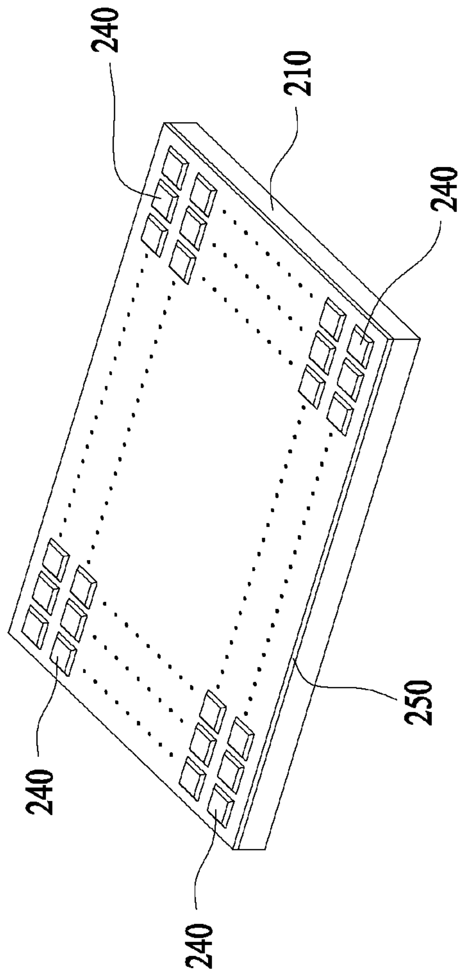
FIG. 2A is a three-dimensional diagram of an illuminated keyboard according to the first embodiment of the present invention.
Figure 2B:
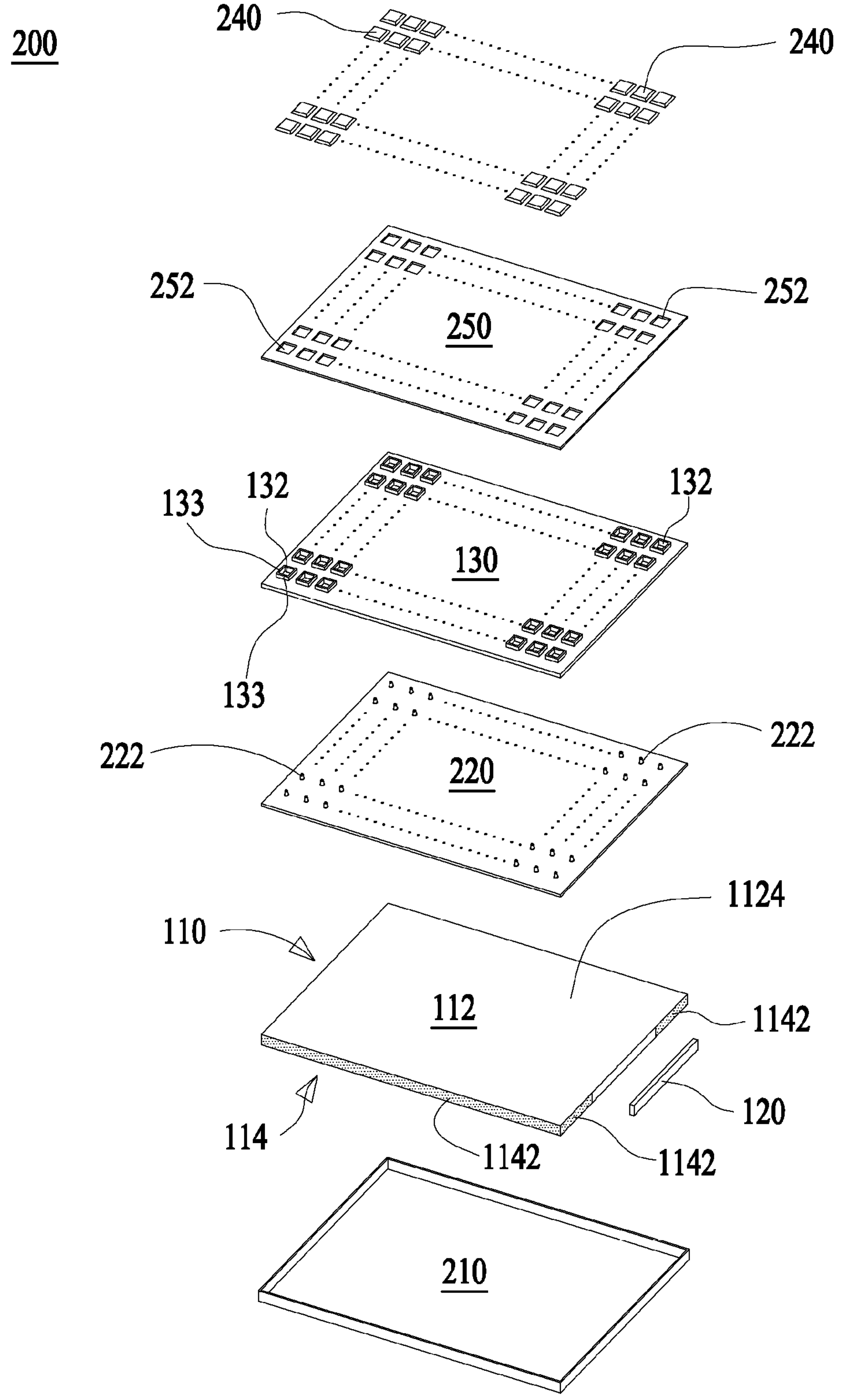
FIG. 2B is an exploded view of the illuminated keyboard according to the first embodiment of the present invention.
Figure 2C:
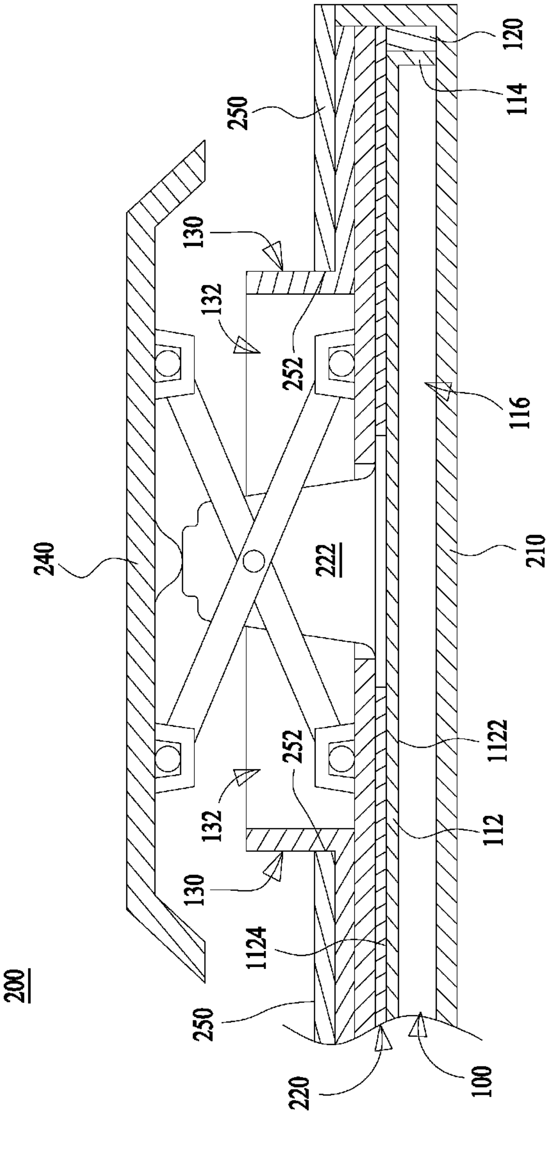
FIG. 2C is a partially cross-sectional view of the illuminated keyboard according to the first embodiment of the present invention.

FIGS. 2A to 2C are a three-dimensional diagram, an exploded view, and a partially cross sectional view of an illuminated keyboard according to the first embodiment of the present invention, respectively.

As shown in FIGS. 2A to 2C, the illuminated keyboard includes a first housing 210, an illumination module 100, a circuit board 220, a shield member 130, a plurality of keys 240 and a second housing 250. The illumination module 100 is disposed on the first housing 210 and includes a cover 110 and a luminescence unit 120. The cover 110 includes a transparent plate 112 having a light incident surface 1122 and a light emitting surface 1124 and a plurality of frames 114 that are disposed on sides of the transparent plate 112. The adjacent frames 114 are connected to each other and surround the transparent plate 112 for forming a trough 116, with the luminescence unit 120 disposed on one of the frames 114 of the cover 110.

When the luminescence unit 120 is operative to irradiate light, the light travels into the trough 116 of the cover 110 through the frame 114 and diffuses in the trough 116. The diffusing light subsequently passes through the light emitting surface 1124 from the light incident surface 1122 of the transparent plate 112 and appears to be emanating outwards. Since the circuit board 220 of the embodiment is composed of light transparent material and is disposed at the side of the light emitting surface 1124 of the transparent plate 112, the light could travel smoothly from the light emitting surface 1124 through the circuit board 220.

A plurality of trigger switches 222 are disposed on the circuit board 220 electrically on which the shield member 130 is provided. The shield member 130 has a plurality of openings 132 corresponding to the plurality of trigger switches 222, and the plurality of keys 240 are respectively inserted in the plurality of openings 132. The light passing through the circuit board 220 will go through the openings 132 and illuminate the keys 240.

In this exemplary embodiment, the second housing 250 of the illuminated keyboard 200 is further configured for covering the shield member 130, the circuit board 220 and the illumination module 100. One or more slots 252 are formed corresponding to the opening(s) 132 of the shield member 130 on the second housing 250 for the light to pass through. However, it is to be noted that the number of the slots 252 could be determined arbitrarily or as the case may be.

Although a common mechanical keyboard is illustrated as an example in the embodiment, the present invention is not limited thereto. A membrane keyboard, a conductive rubber keyboard, or a capacitive keyboard or the like may be used as the keyboard 200 of the present invention. In order to avoid unnecessary confusion of the present invention, the principle and action of the keyboard 200 will not be described herein.

Figure 3A:
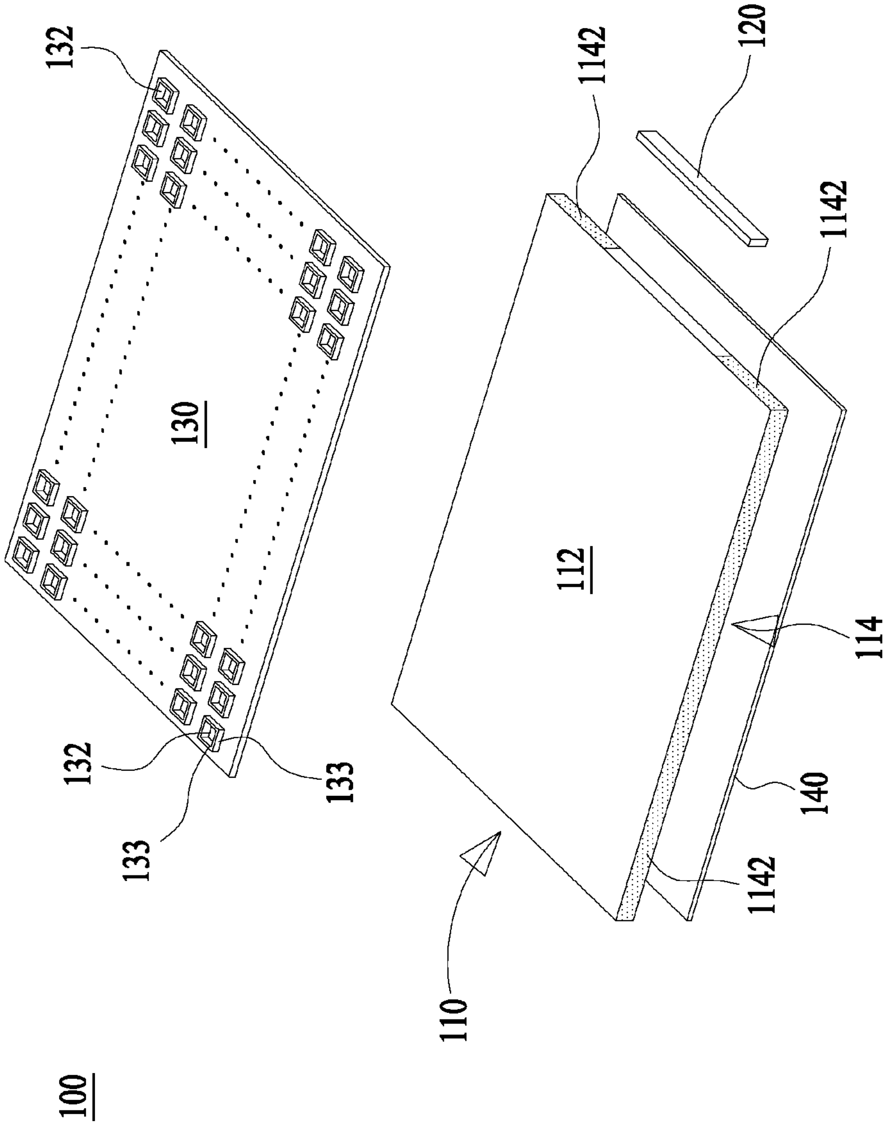
FIG. 3A is an exploded view of an illumination module according to a second embodiment of the present invention.
Figure 3B:
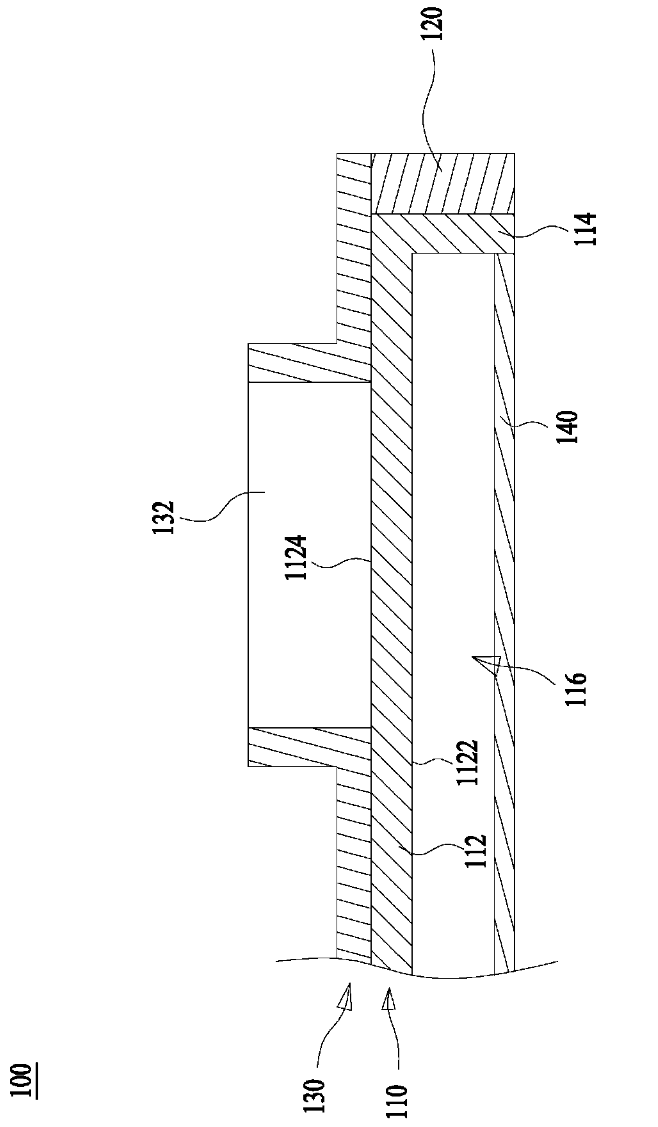
FIG. 3B is a cross-sectional view of the illumination module according to the second embodiment of the present invention.

FIGS. 3A and 3B are an exploded view and a cross sectional view of an illumination module 100 according to a second embodiment of the present invention, respectively.

As shown in FIGS. 3A and 3B, the second embodiment is different from the first embodiment in that the illumination module 100 of the former further includes a reflector 140 opposite to the light incident surface 1122 of the cover 110. The reflector 140 is disposed on the frame 114 of the cover 110 and covers the trough 116. As a result, when the luminescence unit 120 irradiates light to travel into the trough 116 and diffuses in the trough 116, it makes the reflected light transmitted to the light emitting surface 1124 from the light incident surface 1122, and consequently enhances luminous intensity of the light emitting surface 1124 of the transparent plate 112.

Moreover, this embodiment could also be applied to other kinds of keyboard such as a membrane keyboard, a conductive rubber keyboard, a capacitive keyboard, and the like, as describe in the first embodiment.

Figure 4A:
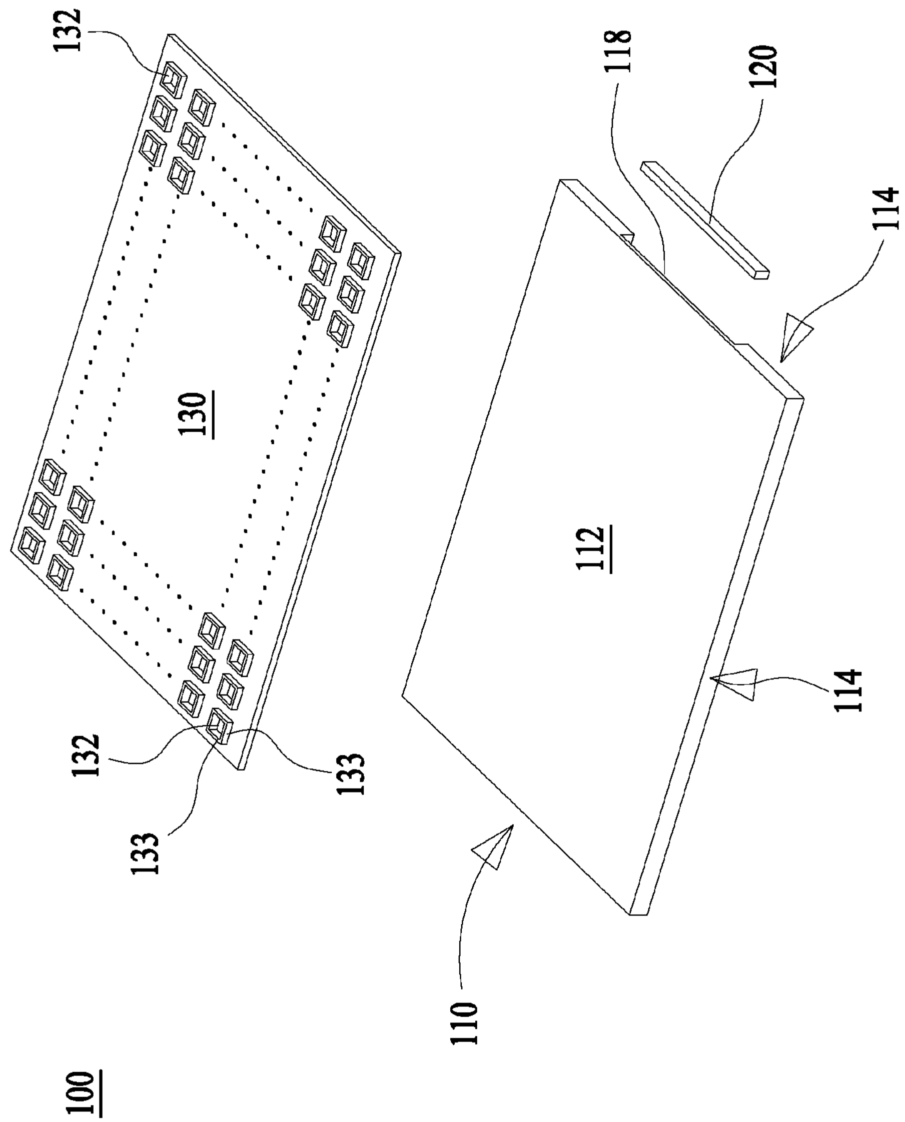
FIG. 4A is an exploded view of an illumination module according to a third embodiment of the present invention.
Figure 4B:
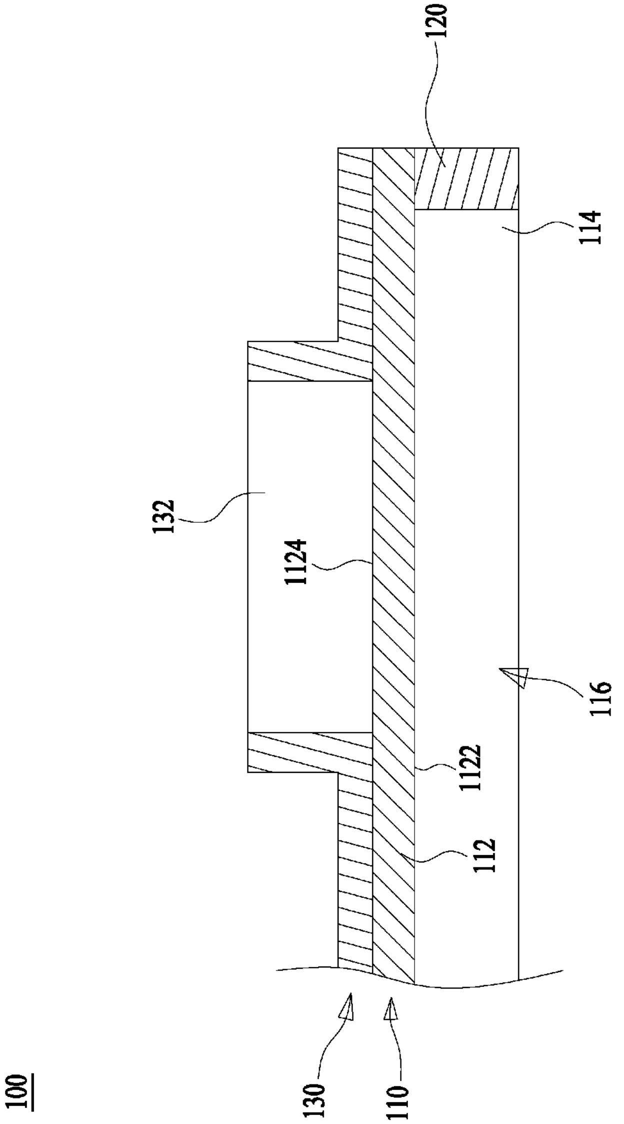
FIG. 4B is a cross-sectional view of the illumination module according to the third embodiment of the present invention.

FIGS. 4A and 4B are an exploded view and a cross-sectional view of an illumination module according to a third embodiment of the present invention, respectively.

As shown in FIGS. 4A and 4B, the difference between this embodiment and the first embodiment is that the frames 114 of the cover 110 in the former are composed of a shading material 1142, and a cavity 118 for mounting a luminescence unit 120 is provided by at least one frame 114. The light emitted by the luminescence unit 120 can directly travel into the trough 116 of the cover 110 passing through the cavity 118 without the hindrance of the frame 114 of the cover 100, thereby reducing energy loss of the light and enhancing luminous intensity measured in the light emitting surface 1124 of the transparent plate 112. Similarly, this embodiment could also be applied to other kinds of keyboard such as a membrane keyboard, a conductive rubber keyboard, a capacitive keyboard, and the like, as described above.

Figure 5:
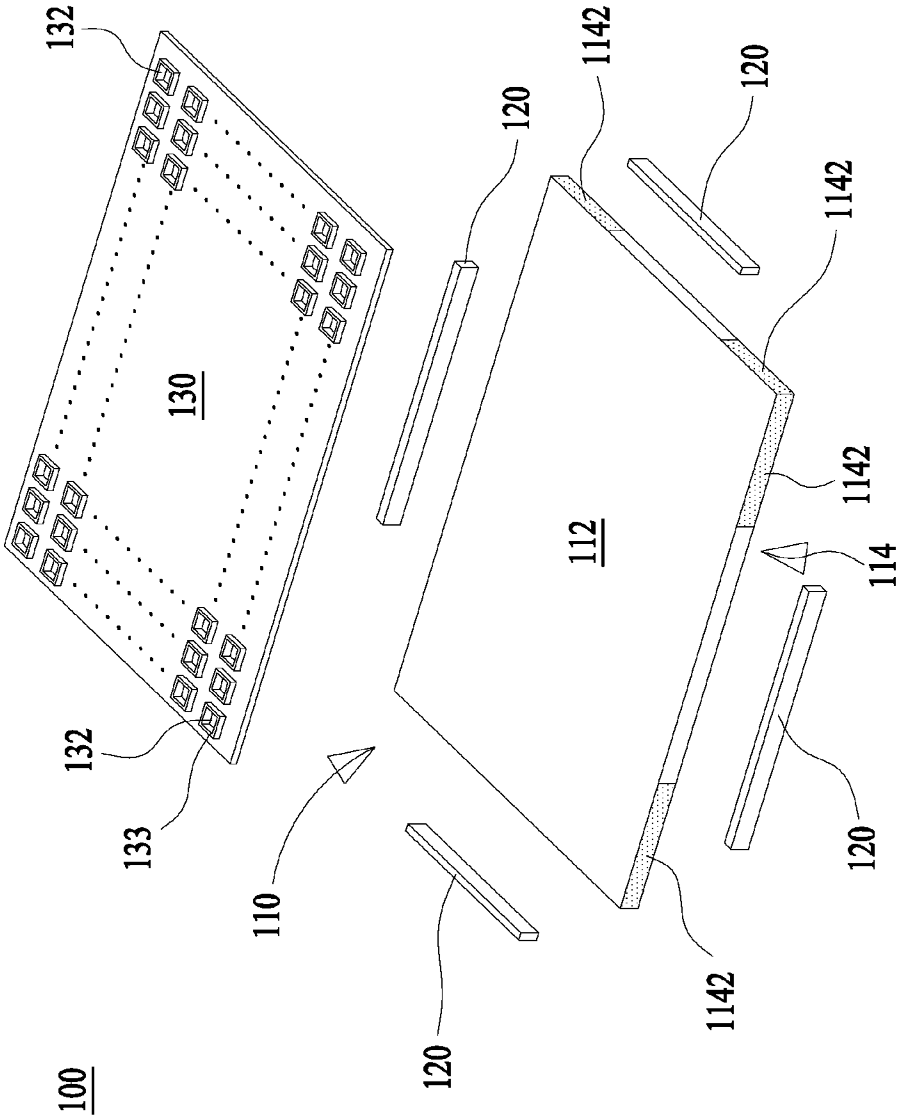
FIG. 5 is a cross-sectional view of an illumination module according to a fourth embodiment of the present invention.

FIG. 5 is a cross-sectional view of an illumination module according to a fourth embodiment of the present invention. The difference between this embodiment and the first embodiment is the number of the luminescence unit 120. In this embodiment, one illumination module 100 includes four luminescence units 120 disposed on each of the four frames 114 of the cover 110 respectively. Therefore, the light power in the trough 116 of the cover 110 and luminous intensity in the light emitting surface 1124 of the transparent plate 112 are both increased. However, as well known to one skilled in the art, the number of the luminescence units 120 being four is simply illustrative rather than limitative.

For example, one luminescence unit 120 could be disposed respectively on each of two opposite or adjacent frames 114 or each of any three frames 114 of the cover 110. Alternatively, a number of luminescence units 120 could even be disposed on a single frame 114 of the cover 110 as desired. Similarly, the fourth embodiment could also be applied to other kinds of keyboard such as a membrane keyboard, a conductive rubber keyboard, a capacitive keyboard, and the like, as described above.

Briefly speaking, in the illuminated keyboard of the present invention, light irradiated from the luminescence unit may diffuse uniformly by means of the cover of the illumination module, and the keys of the illuminated keyboard are inserted in the openings of the shield member of the illumination module for sheltering effectively the light from leaking out through the gaps between adjacent keys.

The invention being thus described, it will be obvious that the same may be varied or modified in many ways. Such variations are not to be regarded as a departure from the spirit and scope of the invention, and all such modifications as would be obvious to one skilled in the art are intended to be included within the scope of the following claims.

What is claimed is:

1. An illumination module for a keyboard having a plurality of keys, the illumination module comprising:
- a cover comprising:
  - a transparent plate made of a light transparent material and comprising a light incident surface and a light emitting surface; and
  - a plurality of frames disposed on sides of the transparent plate, the frames adjacent to each other being connected to form a trough;
- a luminescence unit for emitting light, disposed on one of the frames; wherein the light is transmitted from the luminescence unit through the frames into the trough and subsequently travels from the light incident surface to the light emitting surface of the transparent plate, and then the light is emitted outwards from the light emitting surface; and
- a shield member disposed on the light emitting surface of the transparent plate and having a plurality of openings, each of the keys of the keyboard is inserted via each one of the openings formed on the shield member, and the light is projected on the keys through the openings.

2. The illumination module of claim 1, wherein the plurality of the frames are made of a light transparent material and coated with a shading material.

3. The illumination module of claim 1, wherein the plurality of the frames are made of a shading material, and at least one of the frames has a cavity for mounting the luminescence unit.

4. The illumination module of claim 1, further comprising a reflector covering the trough and connected to the plurality of the frames and located facing the light incident surface of the cover.

5. The illumination module of claim 1, wherein the light emitting surface of the cover is a polished mirror surface.

6. The illumination module of claim 1, wherein the light incident surface of the cover is a textured prism surface.

7. The illumination module of claim 1, wherein the shield member further comprises a plurality of sidewalls disposed along sides of the openings, and the sidewalls adjacent to each other are connected.

8. An illuminated keyboard comprising:

a first housing;

an illumination module disposed on the first housing, comprising:

a cover comprising:

a transparent plate made of a light transparent material and having a light incident surface and a light emitting surface; and a plurality of frames disposed on sides of the transparent plate, and the frames adjacent to each other are connected to form a trough;

a luminescence unit disposed on one of the frames, wherein light is transmitted from the luminescence unit through the frames into the trough and subsequently travels from the light incident surface to the light emitting surface of the transparent plate, and then the light is emitted outwards from the light emitting surface;

a circuit board made of a light transparent material, disposed on the light emitting surface of the cover, and electrically provided with a plurality of trigger switches;

a shield member disposed on the circuit board and having a plurality of openings corresponding to the plurality of the trigger switches respectively; and a plurality of keys respectively inserted in the openings of the shield member, and the light is projected on the keys after passing through the circuit board and the openings; and a second housing covering the shield member, the circuit board and the illumination module and having a slot facing the openings of the shield member, through which the light is transmitted out of the second housing.

9. The illuminated keyboard of claim 8, wherein the plurality of the frames are made of a light transparent material and coated with a shading material.

10. The illuminated keyboard of claim 8, wherein the plurality of the frames are made of a shading material, and at least one of the frames has a cavity for mounting the luminescence unit.

11. The illuminated keyboard of claim 8, further comprising a reflector covering the trough and connected to the plurality of the frames and located facing the light incident surface of the cover.

12. The illuminated keyboard of claim 8, wherein the shield member further comprises a plurality of sidewalls disposed along sides of the openings, and the sidewalls adjacent to each other are connected.

* * * * *